(12) United States Patent
Cheong et al.

(10) Patent No.: US 9,559,220 B2
(45) Date of Patent: Jan. 31, 2017

(54) SOLAR CELL

(71) Applicant: LG ELECTRONICS INC., Seoul (KR)

(72) Inventors: Juhwa Cheong, Seoul (KR); Yiyin Yu, Seoul (KR); Youngsung Yang, Seoul (KR); Yongduk Jin, Seoul (KR); Manhyo Ha, Seoul (KR); Seongeun Lee, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 14/974,407

(22) Filed: Dec. 18, 2015

(65) Prior Publication Data

US 2016/0111560 A1 Apr. 21, 2016

Related U.S. Application Data

(62) Division of application No. 13/543,135, filed on Jul. 6, 2012, now Pat. No. 9,240,499.

(30) Foreign Application Priority Data

Dec. 21, 2011 (KR) .................. 10-2011-0139066

(51) Int. Cl.
*H01L 31/00* (2006.01)
*H01L 31/0216* (2014.01)
*H01L 31/0224* (2006.01)
*H01L 31/02* (2006.01)

(52) U.S. Cl.
CPC ... *H01L 31/02167* (2013.01); *H01L 31/02008* (2013.01); *H01L 31/022425* (2013.01); *H01L 31/022433* (2013.01); *Y02E 10/50* (2013.01)

(58) Field of Classification Search
CPC .............. H01L 31/02167; H01L 31/022425; H01L 31/022433; Y02E 10/50
USPC ........................ 136/252, 256, 261
See application file for complete search history.

(56) References Cited

U.S. PATENT DOCUMENTS

| | | |
|---|---|---|
| 4,881,979 A | 11/1989 | Lewis |
| 2009/0165855 A1 | 7/2009 | Sun et al. |
| 2010/0012185 A1 | 1/2010 | Schmid et al. |
| 2011/0100458 A1 | 5/2011 | Kang et al. |
| 2015/0179837 A1 | 6/2015 | Cheong et al. |

*Primary Examiner* — Lindsey Bernier
(74) *Attorney, Agent, or Firm* — Birch, Stewart, Kolasch & Birch, LLP

(57) ABSTRACT

A solar cell is discussed. The solar cell includes a substrate of a first conductive type, an emitter region which is positioned at a front surface of the substrate and has a second conductive type different from the first conductive type, a front passivation region including a plurality of layers which are sequentially positioned on the emitter region, a back passivation region which is positioned on a back surface opposite the front surface of the substrate and includes three layers, a plurality of front electrodes which pass through the front passivation region and are connected to the emitter region, and at least one back electrode which passes through the back passivation region and is connected to the substrate.

20 Claims, 3 Drawing Sheets

SOLAR CELL

CROSS REFERENCE TO RELATED APPLICATIONS

This application is a divisional of copending U.S. application Ser. No. 13/543,135, filed on Jul. 6, 2012, which claims priority to and the benefit of Korean Patent Application No. 10-2011-0139066 filed in the Korean Intellectual Property Office on Dec. 21, 2011. The entire contents of all these applications are incorporated herein by reference.

BACKGROUND OF THE INVENTION

Field of the Invention

Embodiments of the invention relate to a solar cell.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, electron-hole pairs including electrons and holes as carriers are produced in the semiconductor parts. The carriers move to the n-type semiconductor part and the p-type semiconductor part under the influence of the p-n junction. Namely, the electrons move to the n-type semiconductor part, and the holes move to the p-type semiconductor part. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is a solar cell including a substrate of a first conductive type, an emitter region which is positioned at a front surface of the substrate and has a second conductive type different from the first conductive type, a front passivation region including a plurality of layers which are sequentially positioned on the emitter region, a back passivation region which is positioned on a back surface opposite the front surface of the substrate and includes three layers, a plurality of front electrodes which pass through the front passivation region and are connected to the emitter region, and at least one back electrode which passes through the back passivation region and is connected to the substrate, wherein the plurality of the back passivation region include a first back passivation layer which is positioned on the back surface of the substrate and is formed of silicon oxide, a second back passivation layer which is positioned on the first back passivation layer and is formed of silicon nitride, and a third back passivation layer which is positioned on the second back passivation layer and is formed of aluminum oxide.

The first back passivation layer may have a thickness of about 5 nm to 30 nm, and the third back passivation layer may have a thickness of about 5 nm to 20 nm.

The first back passivation layer and the third back passivation layer may have the same thickness.

A thickness of the second back passivation layer may be greater than a thickness of the first back passivation layer and a thickness of the third back passivation layer.

Each of the first back passivation layer and the third back passivation layer may have the thickness of about 10 nm, and the second back passivation layer may have the thickness of about 90 nm.

The first back passivation layer may have a thickness of about 5 nm to 30 nm, the second back passivation layer may have a thickness of about 10 nm to 200 nm, and the third back passivation layer may have a thickness of about 5 nm to 20 nm.

The plurality of layers of the front passivation region may include an aluminum oxide layer which is positioned on the emitter region and is formed of aluminum oxide, and a silicon nitride layer which is positioned on the aluminum oxide layer and is formed of silicon nitride.

The aluminum oxide layer may have a thickness of about 5 nm to 20 nm, and the silicon nitride layer may have a thickness of about 10 nm to 200 nm.

A thickness of the silicon nitride layer may be greater than a thickness of the aluminum oxide layer.

The silicon nitride layer may have the thickness of about 90 nm, and the aluminum oxide layer may have the thickness of about 10 nm.

The plurality of layers of the front passivation region may further include a silicon oxide layer which is positioned between the emitter region and the aluminum oxide layer and is formed of silicon oxide.

The silicon oxide layer may have a thickness of about 5 nm to 30 nm.

Each of the silicon oxide layer and the aluminum oxide layer may have a thickness of about 10 nm, and the silicon nitride layer may have a thickness of about 90 nm.

The silicon oxide layer and the first back passivation layer may have the same thickness.

The first conductive type may be an n-type, and the second conductive type may be a p-type.

The aluminum oxide layer and the third back passivation layer may have the same thickness.

The at least one back electrode may include one back electrode having a plurality of contact portions which locally abut the back surface of the substrate. The solar cell may include a plurality of back surface field regions respectively positioned at the back surface of the substrate abutting the plurality of contact portions.

The at least one back electrode may include a plurality of back electrodes which locally abut the back surface of the substrate and are separated from one another. The solar cell may include a back surface field region which is positioned at the back surface of the substrate and abuts the plurality of back electrodes.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
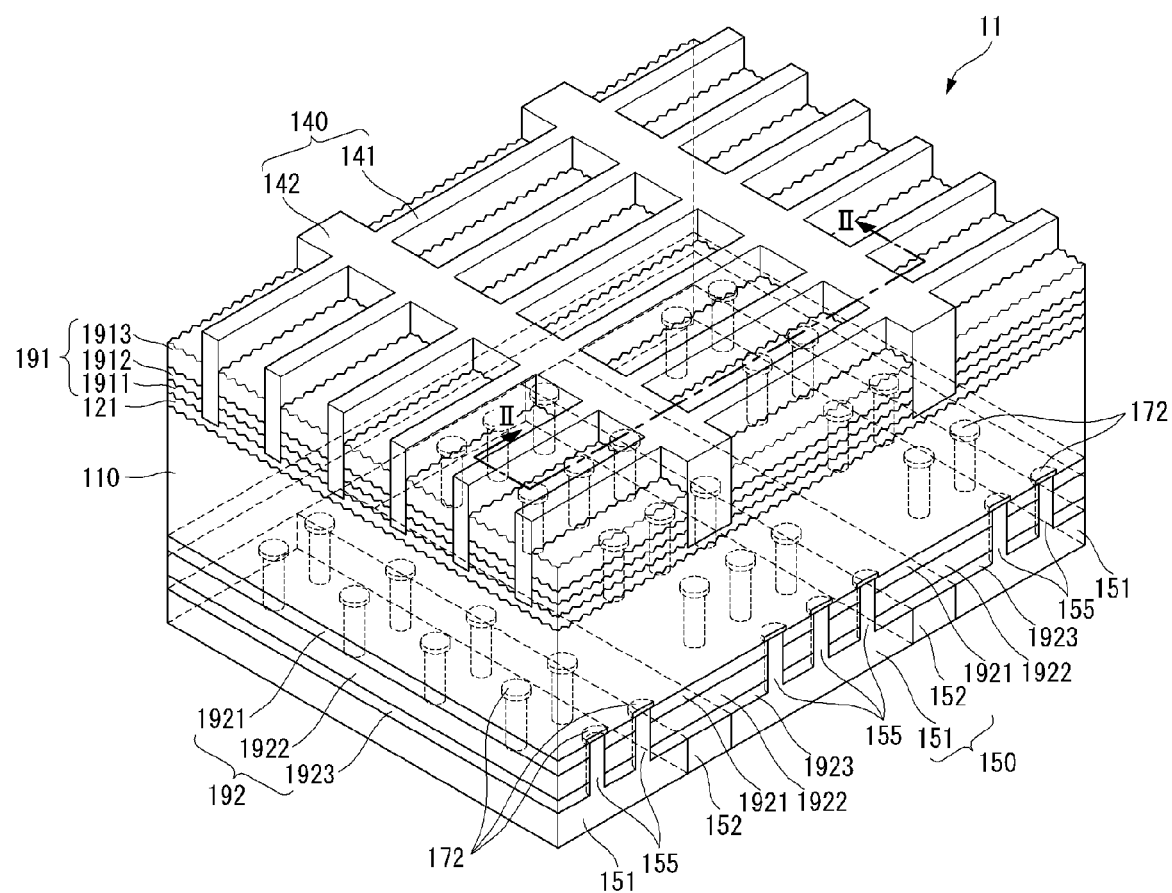
FIG. 1 is a partial perspective view of a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It should be noticed that a detailed description of known arts will be omitted if such descriptions of the known arts could obscure understanding of the embodiments of the invention.

In the drawings, the thickness of layers, films, panels, regions, etc., are exaggerated for clarity. It should be understood that when an element such as a layer, film, region, or substrate is referred to as being "on" another element, it can be directly on the other element or intervening elements may also be present. In contrast, when an element is referred to as being "directly on" another element, there are no intervening elements present.

Example embodiments of the invention will be described with reference to FIGS. 1 to 3.

A solar cell according to an example embodiment of the invention is described in detail with reference to FIGS. 1 and 2.

As shown in FIG. 1, a solar cell 11 according to an example embodiment of the invention includes a substrate 110, an emitter region 121 positioned at an incident surface (hereinafter, referred to as "a front surface or a first surface") of the substrate 110 on which light is incident, a front passivation region (or a first passivation region) 191 positioned directly on the emitter region 121 (i.e., on the front surface of the substrate 110), a back passivation region (or a second passivation region) 192 positioned directly on a back surface (or a second surface) opposite the front surface of the substrate 110, a front electrode part 140 which is positioned on the front surface of the substrate 110 and is connected to the emitter region 121, a back electrode part 150 which is positioned on the back surface of the substrate 110 and is connected to the substrate 110, and a plurality of back surface field regions 172 selectively (or locally) positioned on the back surface of the substrate 110.

The substrate 110 is a semiconductor substrate formed of a semiconductor such as first conductive type silicon, for example, n-type silicon, though not required. The semiconductor used in the substrate 110 is a crystalline semiconductor, such as single crystal silicon and polycrystalline silicon.

When the substrate 110 is of an n-type, the substrate 110 is doped with impurities of a group V element such as phosphorus (P), arsenic (As), and/or antimony (Sb). Alternatively, the substrate 110 may be of a p-type and/or may be formed of a semiconductor material other than silicon. If the substrate 110 is of the p-type, the substrate 110 may be doped with impurities of a group III element such as boron (B), gallium (Ga), and/or indium (In).

Figure 2:
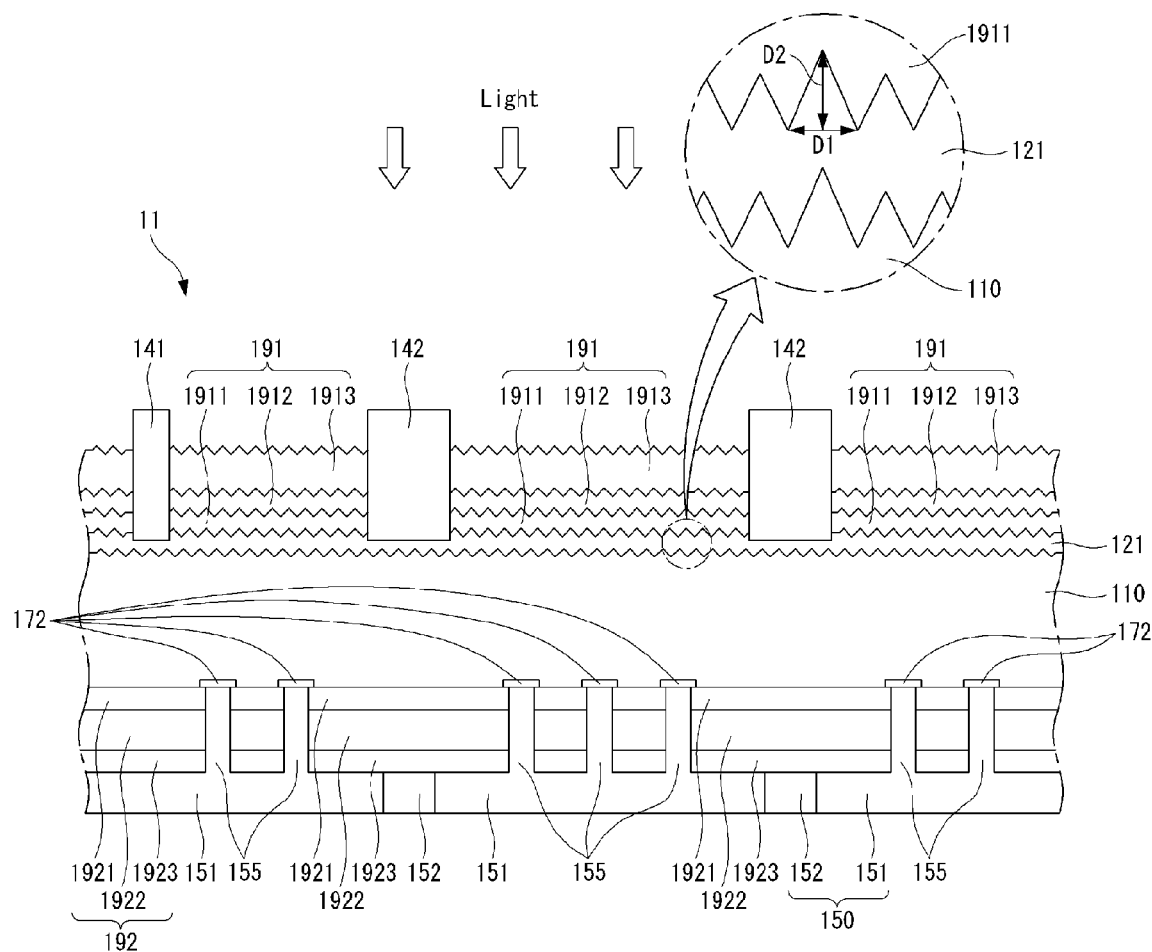
FIG. 2 is a cross-sectional view taken along line II-II of FIG. 1.

As shown in FIGS. 1 and 2, a separate texturing process is performed on a flat front surface of the substrate 110 to form a textured surface corresponding to an uneven surface having a plurality of protrusions and a plurality of depressions or having uneven characteristics. In this instance, the emitter region 121 and the front passivation region 191 positioned on the front surface of the substrate 110 have the textured surface.

As described above, because the front surface of the substrate 110 is textured, an incident area of the substrate 110 increases and a light reflectance decreases due to a plurality of reflection operations resulting from the textured surface. Hence, an amount of light incident on the substrate 110 increases, and the efficiency of the solar cell 11 is improved.

As shown in FIGS. 1 and 2, maximum diameters D1 and maximum heights D2 of the plurality of protrusions of the textured surface of the substrate 110 are non-uniform. Therefore, the plurality of protrusions have the different maximum diameters D1 and the different maximum heights D2.

The emitter region 121 positioned at the front surface of the substrate 110 is an impurity doped region doped with impurities of a second conductive type (for example, p-type) opposite the first conductive type (for example, n-type) of the substrate 110. Thus, the emitter region 121 of the second conductive type forms a p-n junction along with a first conductive type region of the substrate 110.

Regarding the carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 121. Thus, when the substrate 110 is of the n-type and the emitter region 121 is of the p-type, the electrons move to the substrate 110 and the holes move to the emitter region 121.

The front passivation region 191 positioned on the emitter region 121 includes a first front passivation layer 1911 positioned directly on the emitter region 121, a second front passivation layer 1912 positioned on the first front passivation layer 1911, and a third front passivation layer 1913 positioned on the second front passivation layer 1912.

The first front passivation layer 1911 is formed of silicon oxide (SiOx), in particular, a thermal oxide, for example, silicon dioxide ($SiO_2$). The first front passivation layer 1911 has a thickness of about 5 nm to 30 nm and a refractive index of about 1.5.

The second front passivation layer 1912 is formed of aluminum oxide ($Al_2O_3$). The second front passivation layer 1912 has a thickness of about 5 nm to 20 nm and a refractive index of about 1.7.

The third front passivation layer 1913 is formed of hydrogenated silicon nitride (SiNx:H). The third front passivation layer 1913 has a thickness of about 10 nm to 200 nm and a refractive index of about 1.5 to 3.

In the embodiment of the invention, the first front passivation layer 1911 and the second front passivation layer 1912 may have the same thickness, and the third front passivation layer 1913 may have a thickness greater than the first and second front passivation layers 1911 and 1912. For example, the thickness of each of the first and second front passivation layers 1911 and 1912 may be about 10 nm, and the thickness of the third front passivation layer 1913 may be about 90 nm.

The front passivation region 191 having the three layers performs a passivation function which converts a defect, for example, dangling bonds existing at and around the front surface of the substrate 110 into stable bonds to thereby prevent or reduce a recombination and/or a disappearance of carriers moving to the surface of the substrate 110.

Because the first front passivation layer 1911 formed of a thermal oxide having the most passivation effect is formed as a lowermost layer of the front passivation region 191 directly adjoining the front surface of the substrate 110, the passivation effect of the front passivation region 191 is improved by the thermal oxide of the first front passivation layer 1911.

In the embodiment of the invention, when the substrate 110 is of the n-type, the emitter region 121 positioned at the front surface of the substrate 110 is of the p-type. Further, the first front passivation layer 1911, which is formed of silicon oxide and has characteristic of positive fixed charges, is positioned directly on the emitter region 121. Thus, because positive charges (i.e., holes) moving to the emitter region 121 have the same polarity as the first front passivation layer 1911, the positive charges (i.e., holes) may be pushed to the back surface of the substrate 110 due to the polarity of the first front passivation layer 1911.

It is preferable, but not required, that the first front passivation layer 1911 may have a minimum thickness capable of performing the passivation effect, so as to prevent an adverse influence of the first front passivation layer 1911 formed of silicon oxide. Hence, as described above, the first front passivation layer 1911 may have the thickness of about 5 nm to 30 nm.

When the thickness of the first front passivation layer 1911 is equal to or greater than about 5 nm, the first front passivation layer 1911 is uniformly coated on the emitter region 121 and more smoothly performs the passivation function. When the thickness of the first front passivation layer 1911 is equal to or less than about 30 nm, the first front passivation layer 1911 formed of silicon oxide does not adversely affect the movement of carriers to the emitter region 121. Further, a manufacturing time and a manufacturing cost of the first front passivation layer 1911 are reduced.

In general, aluminum oxide ($Al_2O_3$) has the characteristic of strong negative fixed charges. Thus, the second front passivation layer 1912 formed of aluminum oxide has the characteristic of strong negative fixed charges. Hence, the strong negative fixed charges of the second front passivation layer 1912 compensate for an influence of weak positive fixed charges of the first front passivation layer 1911 which underlies the second front passivation layer 1912 and adversely affects holes moving to the emitter region 121.

In addition, an intensity of the negative fixed charges of the second front passivation layer 1912 is much greater than an intensity of the positive fixed charges of the first front passivation layer 1911. Therefore, holes moving to the emitter region 121 are drawn to the second front passivation layer 1912 because of an influence of the negative fixed charges of the second front passivation layer 1912. Further, electrons moving to the emitter region 121 are pushed to the back surface of the substrate 110 because of the influence of the negative fixed charges of the second front passivation layer 1912.

As described above, when the substrate 110 is of the n-type, a recombination and/or a disappearance of electrons and holes are prevented or reduced and also an amount of carriers moving to the emitter region 121 and the back surface of the substrate 110 further increases because of the negative fixed charges of the second front passivation layer 1912.

As described above, the second front passivation layer 1912 has a thickness of about 5 nm to 20 nm. When the thickness of the second front passivation layer 1912 is equal to or greater than about 5 nm, the second front passivation layer 1912 is uniformly coated on the first front passivation layer 1911, stably performs the passivation function, and stably holds the intensity of the negative fixed charges. When the thickness of the second front passivation layer 1912 is equal to or less than about 20 nm, increases in the manufacturing cost and manufacturing time caused by an unnecessary increase in the thickness of the second front passivation layer 1912 are prevented or reduced.

Further, when the second front passivation layer 1912 formed of aluminum oxide performing the passivation function by use of oxygen is exposed to oxygen, the passivation effect of the second front passivation layer 1912 using aluminum oxide is greatly reduced. Therefore, the third front passivation layer 1913 formed of hydrogenated silicon nitride is positioned on the second front passivation layer 1912.

Thus, the third front passivation layer 1913 serves as a capping layer for protecting the second front passivation layer 1912.

The third front passivation layer 1913 performs the passivation function by use of hydrogen. More specifically, the third front passivation layer 1913 moves hydrogen contained in the third front passivation layer 1913 to the front surface of the substrate 110 in a thermal process for forming the front electrode part 140, thereby performing the passivation function.

Accordingly, the third front passivation layer 1913 is formed as an uppermost layer of the front passivation region 191, so that the third front passivation layer 1913 serves as the capping layer of the second front passivation layer 1912 at the front surface of the substrate 110 and improves the passivation effect at the front surface of the substrate 110.

As described above, because the front passivation region 191 having the multi-layered structure (for example, the three layers) is formed on the front surface of the substrate 110 to perform the passivation function, the passivation effect at the front surface of the substrate 110 is further improved.

In the embodiment of the invention, the front passivation region 191 serves as an anti-reflection region capable of minimizing the reflection of light incident on the front surface of the substrate 110, thereby increasing an amount of light incident on the substrate 110.

Because the second front passivation layer 1912 is positioned on the first front passivation layer 1911 having the refractive index less than the second front passivation layer 1912, a refractive index in going from air (having a refractive index of about 1) to the substrate 110 (having a refractive index of about 3.4) gradually increases. Thus, the first and second front passivation layers 1911 and 1912 may have as thin a thickness as possible, so as to prevent or minimize a reduction in an anti-reflection effect of light resulting from a reversion of the refractive index and to smoothly obtain the passivation effect. Hence, as described above, each of the first and second front passivation layers 1911 and 1912 may have the thickness of about 10 nm, for example.

The front electrode part 140 includes a plurality of front electrodes 141 and a plurality of front bus bars 142 connected to the plurality of front electrodes 141.

The plurality of front electrodes 141 are connected to the emitter region 121 and are separated from one another. The plurality of front electrodes 141 extend parallel to one another in a fixed direction. The plurality of front electrodes 141 collect carriers (for example, holes) moving to the emitter region 121.

The plurality of front bus bars 142 are connected to the emitter region 121 and extend parallel to one another in a direction crossing the front electrodes 141.

In this instance, the front bus bars 142 are positioned on the same level layer as the front electrodes 141 and are electrically and physically connected to the front electrodes 141 at crossings of the front electrodes 141 and the front bus bars 142.

Accordingly, as shown in FIG. 1, the plurality of front electrodes 141 have a stripe shape extending in a transverse (or longitudinal) direction, and the plurality of front bus bars 142 have a stripe shape extending in a longitudinal (or transverse) direction. Hence, the front electrode part 140 has a lattice shape on the front surface of the substrate 110.

The front bus bars 142 have to collect not only carriers (for example, holes) moving from the emitter region 121 but also carriers collected by the front electrodes 141 crossing the front bus bars 142 and have to move the collected carriers in a desired direction. Thus, a width of each front bus bar 142 is greater than a width of each front electrode 141.

The front bus bars 142 are connected to an external device and output the collected carriers to the external device.

The front electrode part 140 including the front electrodes 141 and the front bus bars 142 is formed of at least one conductive material such as silver (Ag).

In the embodiment of the invention, the number of front electrodes 141 and the number of front bus bars 142 may vary, if necessary or desired.

As shown in FIGS. 1 and 2, the front electrode part 140 including the front electrodes 141 and the front bus bars 142 passes through the front passivation region 191 of the multi-layered structure positioned on the front surface of the substrate 110 and is connected to the emitter region 121. Hence, the front passivation region 191 including the first to third front passivation layers 1911 to 1913 is not positioned in a formation area of the front electrode part 140 in the front surface of the substrate 110. Namely, the first to third front passivation layers 1911 to 1913 are positioned between the front electrodes 141 and between the front bus bars 142.

The back passivation region 192 positioned on the back surface of the substrate 110 may include three passivation layers in the same manner as the front passivation region 191.

More specifically, the back passivation region 192 includes a first back passivation layer 1921 which is positioned directly on the back surface of the substrate 110 and is formed of silicon oxide (SiOx), in particular, a thermal oxide, for example, silicon dioxide (SiO$_2$), a second back passivation layer 1922 which is positioned on the first back passivation layer 1921 and is formed of hydrogenated silicon nitride (SiNx:H), and a third back passivation layer 1923 which is positioned on the second back passivation layer 1922 and is formed of aluminum oxide (Al$_2$O$_3$).

The first back passivation layer 1921 may be formed along with the first front passivation layer 1911. In this instance, the first back passivation layer 1921 may have the same layer characteristic as the first front passivation layer 1911. Further, the third back passivation layer 1923 may be formed along with the second front passivation layer 1912, and thus, may have the same layer characteristic as the second front passivation layer 1912. Thus, the first back passivation layer 1921 may have the same thickness and the same composition as the first front passivation layer 1911, and the third back passivation layer 1923 may have the same thickness and the same composition as the second front passivation layer 1912.

The first back passivation layer 1921 has a thickness of about 5 nm to 30 nm and a refractive index of about 1.5. The third back passivation layer 1923 has a thickness of about 5 nm to 20 nm and a refractive index of about 1.7.

The second back passivation layer 1922 has a thickness of about 10 nm to 200 nm and a refractive index of about 1.5 to 3 in the same manner as the third front passivation layer 1913.

The first back passivation layer 1921 formed of silicon oxide and the third back passivation layer 1923 formed of aluminum oxide may have the same thickness, and the second back passivation layer 1922 formed of hydrogenated silicon nitride may have the thickness greater than the first and third back passivation layers 1921 and 1923, in the same manner as the front passivation region 191.

Since effects obtained when each of the first to third back passivation layers 1921 to 1923 satisfies the above-described thickness range are the same as the first to third front passivation layers 1911 to 1913, a further description may be briefly made or may be entirely omitted.

Further, the first to third back passivation layers 1921 to 1923 perform the same function as the first to third front passivation layers 1911 to 1913.

More specifically, the passivation effect of the back passivation region 192 is improved by the first back passivation layer (i.e., the thermal oxide layer) 1921, which is positioned directly on the back surface of the substrate 110 and is formed as a lowermost layer of the back passivation region 192. Further, the passivation effect of the back passivation region 192 is further improved because of hydrogen contained in the second back passivation layer (i.e., the hydrogenated silicon nitride layer) 1922 positioned on the first back passivation layer 1921.

Electrons moving to the back surface of the substrate 110 are drawn to the back surface of the substrate 110 because of the first and second back passivation layers 1921 and 1922 each having the characteristic of positive fixed charges. Further, holes moving to the back surface of the substrate 110 are pushed to the emitter region 121 positioned at the front surface of the substrate 110. Because the third back passivation layer (i.e., the aluminum oxide layer) 1923 having the characteristic of strong negative fixed charges is formed as an uppermost layer of the back passivation region 192, the negative fixed charges of the third back passivation layer 1923 are blocked or shielded by the first and second back passivation layers 1921 and 1922 underlying the third back passivation layer 1923. Hence, an adverse influence of the third back passivation layer 1923 on electrons moving to the back surface of the substrate 110 is prevented or reduced.

Accordingly, the back passivation region 192 including the three layers improves the passivation effect in the back surface of the substrate 110. Further, the back passivation region 192 further improves a field passivation effect using the fixed charges because of the disposition order of layers different from the front passivation region 191.

Because the back passivation region 192 including the three layers is formed on the back surface of the substrate 110, light passing through the substrate 110 reflected by the back passivation region 192 and is re-incident on the substrate 110. Thus, an amount of light incident on the substrate 110 further increases.

The front passivation region 191 and the back passivation region 192 may be formed using various methods.

For example, the emitter region 121 is formed at the substrate 110, and then silicon oxide (for example, silicon dioxide (SiO$_2$)) is coated on each of the front surface (i.e., on the emitter region 121) and the back surface of the substrate 110 using a furnace to simultaneously form the first front passivation layer 1911 and the first back passivation layer 1921. Subsequently, hydrogenated silicon nitride (SiNx:H) is stacked on the first back passivation layer 1921 of the substrate 110 using a plasma enhanced chemical vapor deposition (PECVD) method to form the second back passivation layer 1922.

Next, aluminum oxide ($Al_2O_3$) is stacked on the first front passivation layer 1911 and the second back passivation layer 1922 using an atomic layer deposition (ALD) method to simultaneously form the second front passivation layer 1912 and the third back passivation layer 1923.

Next, hydrogenated silicon nitride (SiNx:H) is stacked on the second front passivation layer 1912 using the PECVD method to form the third front passivation layer 1913.

As described above, because the silicon oxide layers 1911 and 1921 are simultaneously formed through one process and also the aluminum oxide layers 1912 and 1923 are simultaneously formed through one process, manufacturing time of the front passivation region 191 and the back passivation region 192 is reduced.

In the embodiment of the invention, each of the front passivation region 191 and the back passivation region 192 has the three layers (i.e., three component layers). Alternatively, the front passivation region 191 may have two layers (i.e., two component layers).

For example, if the front passivation region 191 has two layers, one of the first front passivation layer 1911 formed of silicon oxide and the second front passivation layer 1912 formed of aluminum oxide may be omitted. In this instance, the first back passivation layer 1921 and the second back passivation layer 1922 may be formed using the PECVD method.

Further, the back passivation region 192 may have two layers. In this instance, one of the first to third back passivation layers 1921 to 1923 may be omitted.

The thicknesses and the refractive indexes of the remaining component front passivation layers may be adjusted depending on the omitted component front passivation layer. Further, the thicknesses and the refractive indexes of the remaining component back passivation layers may be adjusted depending on the omitted component back passivation layer. Hence, the field passivation effect using the fixed charges and the anti-reflection effect of light may be maintained even if the front passivation layer and/or the back passivation layer are omitted.

Each of the plurality of back surface field regions 172 locally or selectively positioned at the back surface of the substrate 110 is a region (for example, an $n^+$-type region) that is more heavily doped than the substrate 110 with impurities of the same conductive type as the substrate 110. Thus, each back surface field region 172 has a sheet resistance less than the substrate 110 and has conductivity greater than the substrate 110.

As shown in FIG. 1, because the plurality of back surface field regions 172 are locally or selectively positioned at the back surface of the substrate 110, a non-formation portion of the back surface field regions 172 exists at least at an edge of the back surface of the substrate 110 and in the middle of the back surface of the substrate 110.

A potential barrier is formed by a difference between impurity concentrations of a first conductive type region (for example, an n-type region) of the substrate 110 and the back surface field regions 172. Hence, the potential barrier prevents or reduces electrons from moving to the back surface field regions 172 used as a moving path of holes and makes it easier for holes to move to the back surface field regions 172. Thus, the back surface field regions 172 reduce an amount of carriers lost by a recombination and/or a disappearance of the electrons and the holes at and around the back surface of the substrate 110 and accelerate a movement of desired carriers (for example, holes), thereby increasing an amount of carriers moving to the back electrode part 150.

The back electrode part 150 is positioned on the back passivation region 192 and includes a back electrode 151 and a plurality of back bus bars 152 connected to the back electrode 151.

The back electrode 151 is positioned on the back passivation region 192 except in a formation area of the plurality of back bus bars 152. Alternatively, the back electrode 151 may be not positioned at the edge of the back surface of the substrate 110.

The back electrode 151 includes a plurality of contact portions 155, which sequentially pass through the third to first back passivation payers 1923 to 1921 and are connected to the plurality of back surface field regions 172. Hence, the back electrode 151 is selectively or locally connected to a portion (i.e., the plurality of back surface field regions 172) of the substrate 110 through the plurality of contact portions 155.

Accordingly, as shown in FIGS. 1 and 2, because the back surface field regions 172 are positioned at and around the back surface of the substrate 110 abutting the contact portions 155, the back surface field region 172 is not positioned at the back surface of the substrate 110 between the adjacent contact portions 155.

As shown in FIG. 1, the plurality of contact portions 155 are spaced apart from one another at a predetermined distance (for example, about 0.5 mm to 1 mm) therebetween and are connected to the substrate 110. Each contact portion 155 has various cross-sectional shapes such as a circle, an oval, and a polygon.

In the embodiment of the invention, the cross-sectional shape of the contact portion 155 is the cross-sectional shape obtained by cutting the contact portion 155 parallel to the flat front surface or the flat back surface of the substrate 110.

Alternatively, each contact portion 155 may have a stripe shape elongating in one direction while being electrically connected to the substrate 110 in the same manner as the front electrode 141. In this instance, the number of contact portions 155 having the stripe shape is much less than the number of contact portions 155 having the circle, the oval, or the polygon.

The contact portions 155 collect carriers (for example, electrons) moving from the substrate 110 and transfer the carriers to the back electrode 151.

Because the back surface field regions 172, which have the conductivity greater than the substrate 110 due to the impurity concentration higher than the substrate 110, contact the contact portions 155, the mobility of carriers from the substrate 110 to the contact portions 155 is improved.

The back electrode 151 including the contact portions 155 may contain a conductive material (for example, aluminum (Al)) different from the front electrode part 140. Alternatively, the back electrode 151 may contain the same conductive material as the front electrode part 140.

The back bus bars 152 connected to the back electrode 151 are positioned on the third back passivation layer 1923, on which the back electrode 151 is not positioned. The back bus bars 152 extend in the same direction as the front bus bars 142 and have a stripe shape. The back bus bars 152 and the front bus bars 142 are positioned opposite to each other with the substrate 110 between them. In embodiments of the invention, the back bus bars 152 and the front bus bars 142 may be aligned.

The back bus bars 152 collect carriers transferred from the back electrode 151, similar to the front bus bars 142. Thus, the back bus bars 152 may be formed of a material with conductivity greater than the back electrode 151. For example, the back bus bars 152 contain at least one conductive material such as silver (Ag).

The back bus bars 152 are connected to the external device and output the collected carriers (for example, holes) to the external device.

Unlike the configuration illustrated in FIG. 1, the back bus bars 152 may partially overlap the back electrode 151 in another embodiment of the invention. In this instance, a contact resistance between the back electrode 151 and the back bus bars 152 may decrease by an increase in a contact area between the back electrode 151 and the back bus bars 152. Hence, an amount of carriers transferred from the back electrode 151 to the back bus bars 152 may increase.

The number of back bus bars 152 shown in FIG. 1 may vary, if necessary or desired.

An operation of the solar cell 11 having the above-described structure is described below.

When light irradiated to the solar cell 11 is incident on the substrate 110 through the front passivation region 191 and the emitter region 121, electron-hole pairs are generated in the substrate 110 by light energy produced based on the incident light. In this instance, because a reflection loss of the light incident on the substrate 110 is reduced by the front passivation region 191 and the textured surfaces, an amount of light incident on the substrate 110 increases.

The electrons move to the n-type substrate 110 and the holes move to the p-type emitter region 121 by the p-n junction of the substrate 110 and the emitter region 121. The holes moving to the p-type emitter region 121 are collected by the front electrodes 141 and the front bus bars 142 and then are transferred to the front bus bars 142. The electrons moving to the n-type substrate 110 are transferred to the contact portions 155 and then are collected by the back bus bars 152 via the back electrode 151. When the front bus bars 142 are connected to the back bus bars 152 using electric wires, current flows therein to thereby enable use of the current for electric power.

In the embodiment of the invention, because the front and back passivation regions 191 and 192 each having the three layers are respectively formed on the front surface and the back surface of the substrate 110, the passivation effect in the front surface and the back surface of the substrate 110 is improved. Hence, an amount of carriers lost by defects decreases.

The recombination and/or the disappearance of electrons and holes are prevented or reduced by the field passivation effect using the fixed charges of the front and back passivation regions 191 and 192. Hence, an amount of carriers moving to the front electrode part 140 and the back electrode part 150 greatly increases.

The front and back passivation regions 191 and 192 each having the above-described structure may be applied to various kinds of solar cells.

For example, the front and back passivation regions 191 and 192 each having the above-described structure may be applied to a bifacial solar cell, in which light is incident on both the front surface and the back surface of the substrate 110.

A bifacial solar cell 12 is described in detail below with reference to FIG. 3.

In the following description, structural elements having the same functions and structures as the solar cell 1 shown in FIGS. 1 and 2 are designated by the same reference numerals, and a further description may be briefly made or may be entirely omitted.

Figure 3:
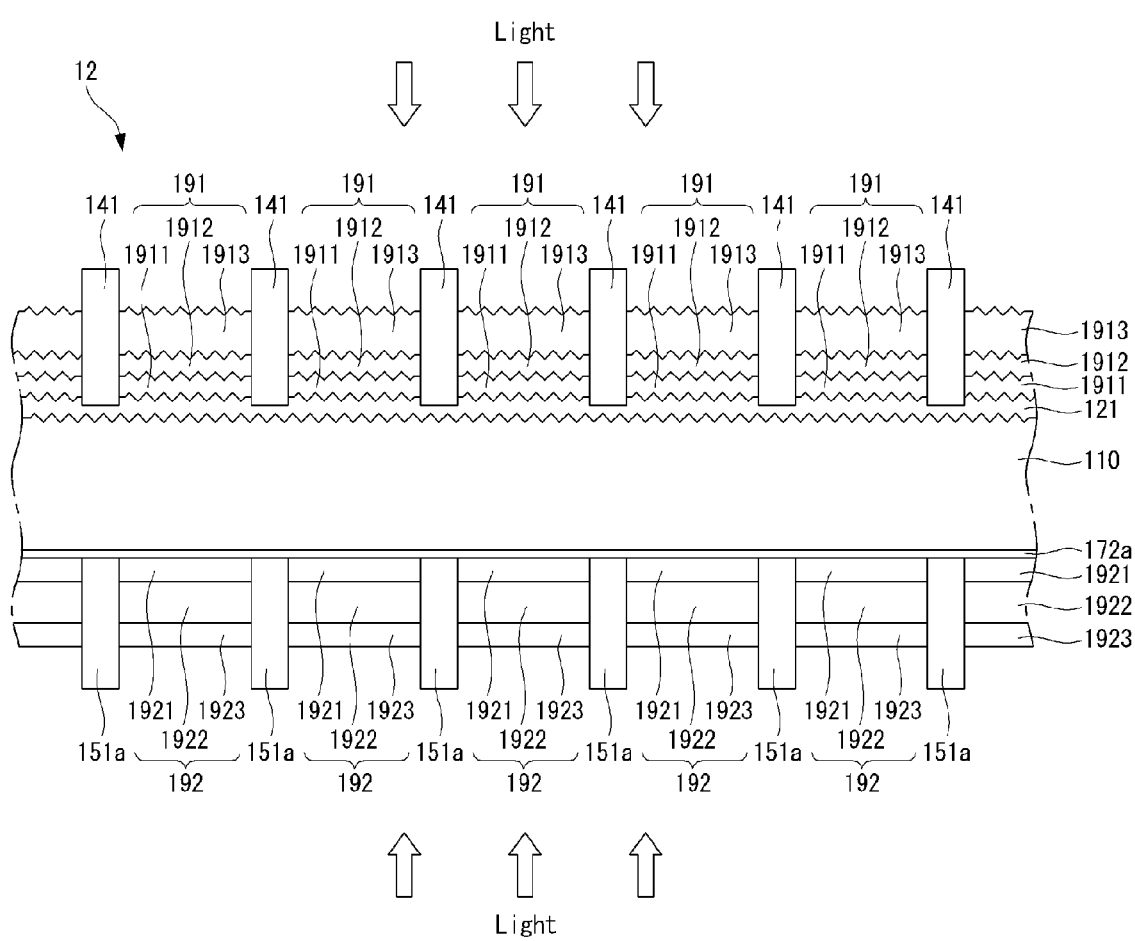
FIG. 3 is a partial cross-sectional view of a solar cell according to another example embodiment of the invention.

As shown in FIG. 3, the bifacial solar cell 12 according to an embodiment of the invention includes an emitter region 121 positioned at a front surface (or a first surface) of a substrate 110, a front passivation region 191 including first, second, and third front passivation layers 1911, 1912, and 1913 which are sequentially positioned on the emitter region 121 in the order named, a plurality of front electrodes (or first electrodes) 141 which pass through the front passivation region 191 and are connected to the emitter region 121, a back surface field region 172a positioned at a back surface (or a second surface) of the substrate 110, a back passivation region 192 including first, second, and third back passivation layers 1921, 1922, and 1923 which are sequentially positioned on the back surface field region 172a in the order named, and a plurality of back electrodes (or second electrodes) 151a which pass through the back passivation region 192 and are connected to the back surface field region 172a.

The back surface field region 172a is an impurity region doped by diffusing impurities of the same conductive type as the substrate 110 into the back surface of the substrate 110. The back surface field region 172a may be formed at the entire back surface of the substrate 110 or at the entire back surface of the substrate 110 except an edge of the back surface of the substrate 110. Thus, the back surface field region 172a shown in FIG. 3 is different from the back surface field regions 172 shown in FIGS. 1 and 2 in the formation position and the number. However, since functions and operations of the back surface field region 172a shown in FIG. 3 are the same as the back surface field regions 172 shown in FIGS. 1 and 2, a further description may be briefly made or may be entirely omitted.

The bifacial solar cell 12 according to the embodiment of the invention includes a plurality of front bus bars, which extend in a direction crossing the front electrodes 141 and are connected to the front electrodes 141, and a plurality of back bus bars, which extend in a direction crossing the back electrodes 151a and are connected to the back electrodes 151a. Thus, the bifacial solar cell 12 includes a front electrode part including the plurality of front electrodes 141 and the plurality of front bus bars and a back electrode part including the plurality of back electrodes 151a and the plurality of back bus bars. In embodiments of the invention, the front electrodes 141 and the back electrodes 151a may be aligned.

Thus, the back electrodes 151a shown in FIG. 3 are different from the back electrodes 151 shown in FIGS. 1 and 2 in the formation position and the number. However, since functions and operations of the back electrodes 151a shown in FIG. 3 are the same as the back electrodes 151 shown in FIGS. 1 and 2, a further description may be briefly made or may be entirely omitted.

In the bifacial solar cell 12 according to the embodiment of the invention, because the front and back passivation regions 191 and 192 each having the three layers are respectively formed on the front surface and the back surface of the substrate 110, a passivation effect in the front surface and the back surface of the substrate 110 is improved. Further, a field passivation effect using fixed charges of the front and back passivation regions 191 and 192 is improved.

Furthermore, because light is incident on both the front surface and the back surface of the substrate 110, an amount of light incident on the substrate 110 increases. Hence, an effect of the bifacial solar cell 12 is further improved.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
   a substrate of a first conductive type;
   an emitter region which is positioned at a front surface of the substrate and has a second conductive type different from the first conductive type;
   a front passivation region including a plurality of layers which are sequentially positioned on the emitter region;
   a back passivation region which is positioned on a back surface opposite the front surface of the substrate and includes three layers;
   a front electrode part which passes through the front passivation region and is connected to the emitter region; and
   a back electrode part which continuously covers an entire back surface of the back passivation region, passes through the back passivation region and is connected to the substrate,
   wherein the plurality of layers of the front passivation region include:
   a silicon oxide layer which is positioned on the emitter region and is formed of silicon oxide;
   an aluminum oxide layer which is positioned on the silicon oxide layer and is formed of aluminum oxide; and
   a silicon nitride layer which is positioned on the aluminum oxide layer and is formed of silicon nitride,
   wherein the aluminum oxide layer is positioned between the silicon oxide layer and the silicon nitride layer,
   wherein the three layers of the back passivation region include:
   a first back passivation layer which is positioned on the back surface of the substrate and is formed of silicon oxide;
   a second back passivation layer which is positioned on the first back passivation layer and is formed of silicon nitride; and
   a third back passivation layer which is positioned on the second back passivation layer and is formed of aluminum oxide,
   wherein the second back passivation layer is positioned between the first back passivation layer and the third back passivation layer,
   wherein the back electrode part includes a back electrode having a plurality of contact portions which locally abut the back surface of the substrate,
   wherein the solar cell further comprises a plurality of back surface field regions respectively positioned at the back surface of the substrate abutting the plurality of contact portions,
   wherein the first back passivation layer is directly on the plurality of back surface field regions, the second back passivation layer is directly on the first back passivation layer, and the third back passivation layer is directly on the second back passivation layer,
   wherein the third back passivation layer is formed as an outermost layer of the three layers of the back passivation region, and
   wherein the plurality of layers of the front passivation region including the silicon oxide layer, the aluminum oxide layer, and the silicon nitride layer sequentially positioned on the front surface of the substrate, and the three layers of the back passivation region including the first back passivation layer, the second back passivation layer, and third back passivation layer sequentially positioned on the back surface of the substrate, are asymmetrical to each other.

2. The solar cell of claim 1, wherein the first back passivation layer has a thickness of 5 nm to 30 nm, and the third back passivation layer has a thickness of 5 nm to 20 nm.

3. The solar cell of claim 2, wherein the first back passivation layer and the third back passivation layer have the same thickness.

4. The solar cell of claim 1, wherein a thickness of the second back passivation layer is greater than a thickness of the first back passivation layer and a thickness of the third back passivation layer.

5. The solar cell of claim 4, wherein each of the first back passivation layer and the third back passivation layer has the thickness of about 10 nm, and the second back passivation layer has the thickness of about 90 nm.

6. The solar cell of claim 1, wherein the first back passivation layer has a thickness of 5 nm to 30 nm, the second back passivation layer has a thickness of 10 nm to 200 nm, and the third back passivation layer has a thickness of 5 nm to 20 nm.

7. The solar cell of claim 1, wherein the aluminum oxide layer has a thickness of 5 nm to 20 nm, and the silicon nitride layer has a thickness of 10 nm to 200 nm.

8. The solar cell of claim 7, wherein a thickness of the silicon nitride layer is greater than a thickness of the aluminum oxide layer.

9. The solar cell of claim 8, wherein the silicon nitride layer has the thickness of about 90 nm, and the aluminum oxide layer has the thickness of about 10 nm.

10. The solar cell of claim 1, wherein the silicon oxide layer has a thickness of 5 nm to 30 nm.

11. The solar cell of claim 10, wherein each of the silicon oxide layer and the aluminum oxide layer has a thickness of about 10 nm, and the silicon nitride layer has a thickness of about 90 nm.

12. The solar cell of claim 1, wherein the silicon oxide layer and the first back passivation layer have the same thickness.

13. The solar cell of claim 1, wherein the first conductive type is an n-type, and the second conductive type is a p-type.

14. The solar cell of claim 1, wherein the aluminum oxide layer and the third back passivation layer have the same thickness.

15. The solar cell of claim 1, wherein the front electrode part includes a plurality of front electrodes and a plurality of front bus bars connected to the plurality of front electrodes at crossings of the plurality of front electrodes and the plurality of front bus bars.

16. The solar cell of claim 1, wherein the front electrode part has a lattice shape on the front surface of the substrate.

17. The solar cell of claim 1, wherein the back electrode part further includes a plurality of back bus bars connected to the back electrode.

18. The solar cell of claim 17, wherein the back electrode covers a back surface of the third back passivation layer except in a formation area of the plurality of back bus bars.

19. The solar cell of claim 1, wherein the plurality of back surface field regions are not positioned at the back surface of the substrate between the adjacent contact portions.

20. The solar cell of claim 1, wherein the back electrode is connected to the plurality of back surface field regions through the plurality of contact portions.

* * * * *